United States Patent
Liu et al.

(10) Patent No.: US 10,600,490 B1
(45) Date of Patent: Mar. 24, 2020

(54) PROGRAMMING OF MEMORY CELLS IN THREE-DIMENSIONAL MEMORY DEVICES

(71) Applicant: YANGTZE MEMORY TECHNOLOGIES CO., LTD., Wuhan (CN)

(72) Inventors: Hongtao Liu, Wuhan (CN); Yongyan Xu, Wuhan (CN); Ming Wang, Wuhan (CN); Lei Jin, Wuhan (CN); Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/149,099

(22) Filed: Oct. 1, 2018

Related U.S. Application Data

(63) Continuation of application No. PCT/CN2018/102946, filed on Aug. 29, 2018.

(51) Int. Cl.
*G11C 16/34* (2006.01)
*G11C 16/10* (2006.01)
(Continued)

(52) U.S. Cl.
CPC ...... *G11C 16/3459* (2013.01); *G11C 16/0483* (2013.01); *G11C 16/10* (2013.01); *G11C 16/14* (2013.01); *G11C 16/34* (2013.01); *G11C 11/5628* (2013.01); *G11C 11/5635* (2013.01); *G11C 11/5671* (2013.01);
(Continued)

(58) Field of Classification Search
CPC ..... G11C 16/10; G11C 16/14; G11C 16/3459; G11C 16/0483; G11C 11/5628; G11C 16/08; G11C 11/5671; G11C 11/5635; H01L 27/11556; H01L 27/11582
See application file for complete search history.

(56) References Cited

U.S. PATENT DOCUMENTS

2009/0124070 A1   5/2009   Yoo et al.
2013/0028027 A1   1/2013   Kim et al.
(Continued)

FOREIGN PATENT DOCUMENTS

CN   103578551 A   2/2014
CN   105304133 A   2/2016
(Continued)

OTHER PUBLICATIONS

International Search Report issued in corresponding International Application No. PCT/CN2018/102946, dated May 31, 2019, 5 pages.
(Continued)

*Primary Examiner* — Ajay Ojha
(74) *Attorney, Agent, or Firm* — Bayes PLLC

(57) ABSTRACT

Embodiments of 3D memory devices and methods for operating the 3D memory devices are disclosed. In an example, a 3D memory device includes a NAND memory string and a peripheral circuit. The NAND memory string extends vertically above a substrate and includes a plurality of memory cells arranged vertically in series. The peripheral circuit is configured to program the memory cells based on incremental step pulse programming (ISPP). Different verification voltages of the ISPP are applied to at least two of the memory cells.

20 Claims, 7 Drawing Sheets

(51) Int. Cl.
*G11C 16/04* (2006.01)
*G11C 16/14* (2006.01)
*H01L 27/11582* (2017.01)
*G11C 11/56* (2006.01)
*G11C 16/08* (2006.01)
*H01L 27/11556* (2017.01)

(52) U.S. Cl.
CPC ......... *G11C 16/08* (2013.01); *H01L 27/11556* (2013.01); *H01L 27/11582* (2013.01)

(56) References Cited

U.S. PATENT DOCUMENTS

| | | | |
|---|---|---|---|
| 2013/0198440 | A1 | 8/2013 | Oh et al. |
| 2016/0019947 | A1* | 1/2016 | Pang ................... G11C 11/5628 365/185.03 |
| 2016/0284419 | A1 | 9/2016 | Shim et al. |
| 2016/0300621 | A1 | 10/2016 | Abe et al. |
| 2017/0117055 | A1* | 4/2017 | Kim .................... G11C 16/3459 |
| 2017/0125117 | A1 | 5/2017 | Tseng et al. |
| 2017/0206978 | A1* | 7/2017 | Joo .................... G11C 16/0483 |
| 2018/0005700 | A1* | 1/2018 | Kang ..................... G11C 16/16 |
| 2018/0137926 | A1 | 5/2018 | Suzuki et al. |

FOREIGN PATENT DOCUMENTS

| | | |
|---|---|---|
| CN | 105518796 A | 4/2016 |
| CN | 107093448 A | 8/2017 |
| CN | 107633864 A | 1/2018 |
| TW | 201419280 A | 5/2014 |

OTHER PUBLICATIONS

Written Opinion of the International Searching Authority issued in corresponding International Application No. PCT/CN2018/102946, dated May 31, 2019, 4 pages.

* cited by examiner

PROGRAMMING OF MEMORY CELLS IN THREE-DIMENSIONAL MEMORY DEVICES

CROSS REFERENCE TO RELATED APPLICATION

This application is continuation of International Application No. PCT/CN2018/102946, filed on Aug. 29, 2018, entitled "PROGRAMMING OF MEMORY CELLS IN THREE-DIMENSIONAL MEMORY DEVICES," which is hereby incorporated by reference in its entirety.

BACKGROUND

Embodiments of the present disclosure relate to three-dimensional (3D) memory devices and operation methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for operating the 3D memory devices are disclosed herein.

In one example, a 3D memory device includes a NAND memory string and a peripheral circuit. The NAND memory string extends vertically above a substrate and includes a plurality of memory cells arranged vertically in series. The peripheral circuit is configured to program the memory cells based on incremental step pulse programming (ISPP). Different verification voltages of the ISPP are applied to at least two of the memory cells.

In another example, a 3D memory device includes a memory array device and a peripheral circuit. The memory array device includes a plurality of NAND memory strings and a plurality of word lines. Each of the NAND memory strings extends vertically above a substrate and includes a plurality of memory cells arranged vertically each at a respective cell depth. Each of the word lines is coupled to a page of memory cells at a same cell depth. The peripheral circuit is coupled to the memory array device and configured to program the memory cells in each of the NAND memory strings through the word lines based on ISPP. Different verification voltages of the ISPP are applied to at least two pages of memory cells at different cell depths.

In still another example, a method for operating a 3D memory device is disclosed. A first memory cell in a 3D NAND memory string is programmed based on ISPP with a first verification voltage. A second memory cell in the 3D NAND memory string is programmed based on ISSP with a second verification voltage. The second verification voltage is greater than the first verification voltage. The second memory cell is above the first memory cell in the 3D NAND memory string.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
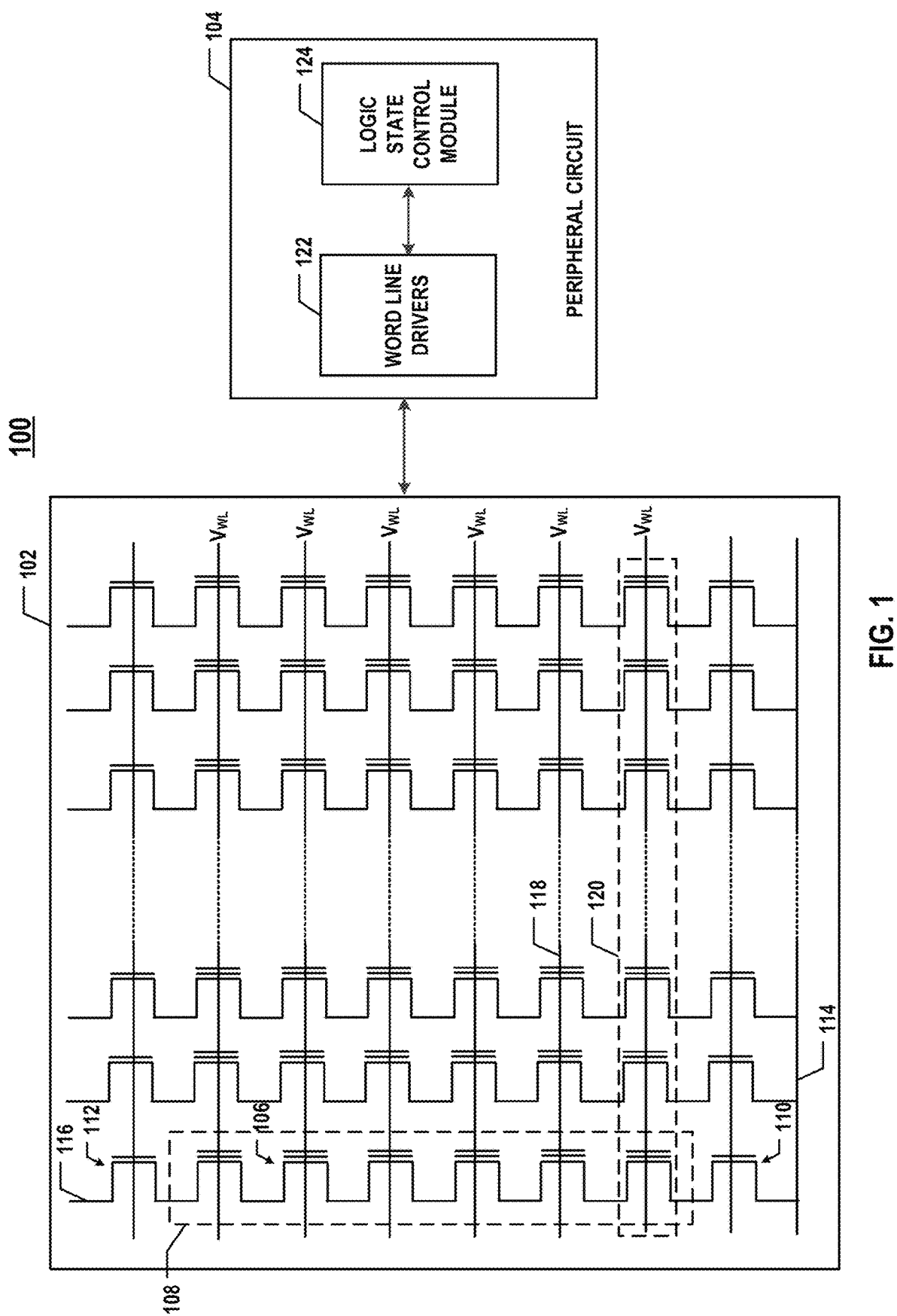
FIG. 1 illustrates a diagram of an exemplary 3D memory device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

Various embodiments in accordance with the present disclosure provide novel programming scheme of 3D memory devices based on nonuniform verification voltages for memory cells having different cell depths. The nonuniform verification voltages can result in a uniform threshold voltage window distribution for memory cells along each 3D NAND memory string, thereby reducing the damage to the memory cells in the lower portion of the 3D NAND memory strings and increasing the durability of the memory cells while still maintaining sufficient reading window. Moreover, by reducing cell threshold voltages of the lower memory cells compared with upper memory cells, data retention of the lower memory cells can be improved as well.

FIG. 1 illustrates a diagram of an exemplary 3D memory device 100, according to some embodiments of the present disclosure. 3D memory device 100 can include a memory array device 102 and a peripheral circuit 104 coupled to memory array device 102. Memory array device 102 can be a 3D NAND Flash memory device in which memory cells 106 are provided in the form of an array of NAND memory strings 108 each extending vertically above a substrate (not shown). In some embodiments, each NAND memory string 108 includes a plurality of memory cells 106 coupled in series and stacked vertically. Each memory cell 106 can hold a continuous, analog value, such as an electrical voltage or charge, that depends on a number of electrons trapped within a region of memory cell 106. Each memory cell 106 can be either a "floating gate" type of memory cell including a floating-gate transistor or a "charge trap" type of memory cell including a charge-trap transistor.

In some embodiments, each memory cell 106 is a single-level cell (SLC) that has two possible memory states and thus, can store one bit of data. For example, the first memory state "0" can correspond to a first range of voltages, and the second memory state "1" can correspond to a second range of voltages. In some embodiments, each memory cell 106 is a multi-level cell (MLC) that is capable of storing more than a single bit of data in more than four memory states. For example, the MLC can store two bits per cell, three bits per cell (also known as triple-level cell (TLC)), or four bits per cell (also known as quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 1, each NAND memory string 108 can be coupled to a source select transistor 110 at its source end and a drain select transistor 112 at its drain end. Source select transistor 110 and drain select transistor 112 can be configured to activate select NAND memory strings 108 (columns of the array) during reading and programming operations. In some embodiments, source select transistors 110 of NAND memory strings 108 in the same memory block are coupled through a same source line 114, e.g., a common source line, for example, to the ground. Drain select transistor 112 of each NAND memory string is coupled to a respective bit line 116 from which data can be read via an output bus (not shown), according to some embodiments. Memory cells 106 of adjacent NAND memory strings 108 can be coupled through word lines 118 that select which row of memory cells is affected by reading and programming operations. In some embodiments, each word line 118 is coupled to a page of memory cells (memory page) 120, which is the smallest physically-addressable data unit for reading and programming operations. The size of memory page 120 in bits can correspond to the number of NAND memory strings 108 coupled by word line 118.

Figure 2:
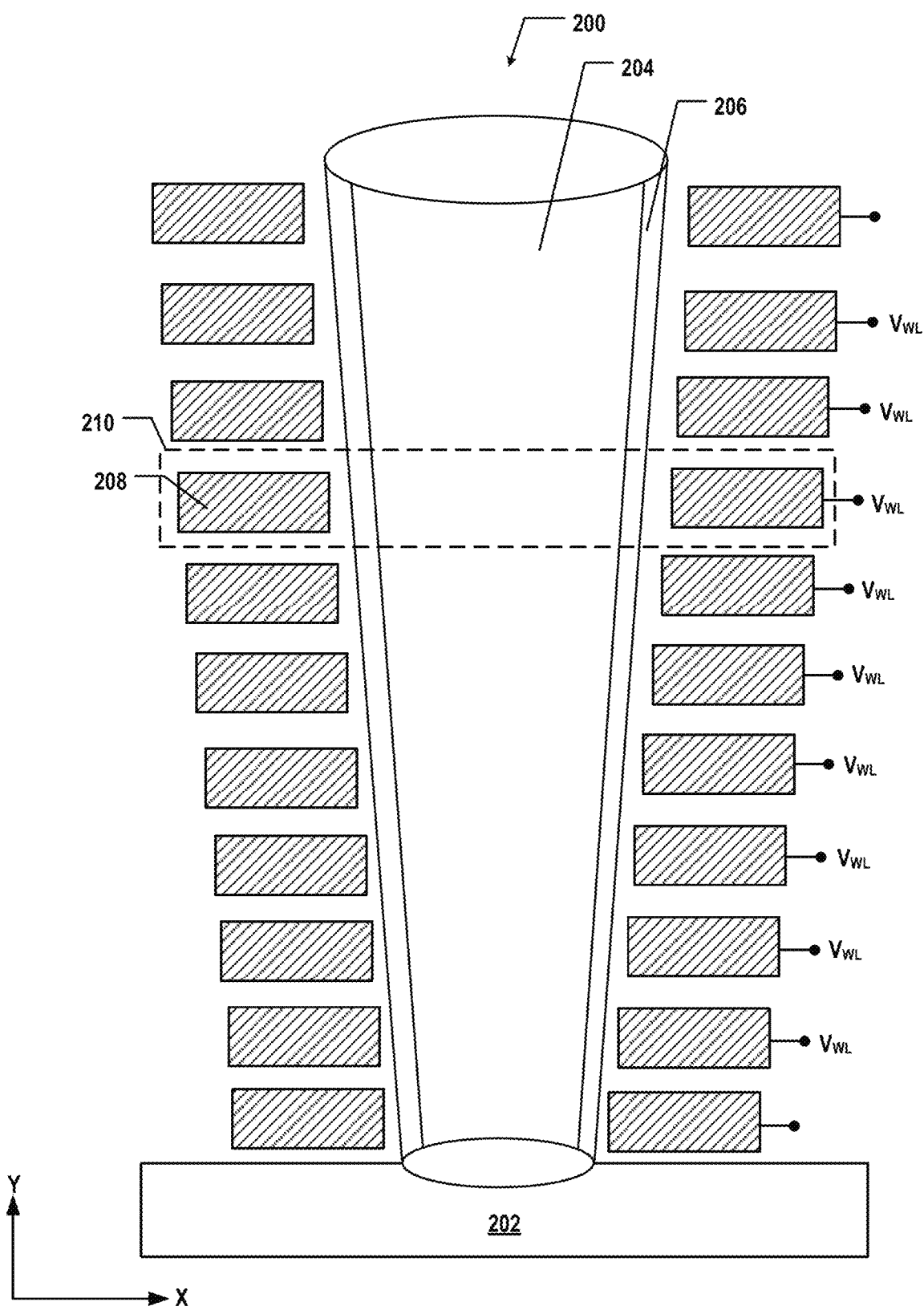
FIG. 2 illustrates a cross-section of an exemplary 3D NAND memory string, according to some embodiments of the present disclosure.

FIG. 2 illustrates a cross-section of an exemplary 3D NAND memory string 200, according to some embodiments of the present disclosure. 3D NAND memory string 200 is an example of NAND memory string 108 illustrated in FIG. 1. As shown in FIG. 2, 3D NAND memory string 200 extends vertically above a substrate 202. Substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials.

3D NAND memory string 200 can include a channel structure having a channel hole filled with semiconductor material(s) (e.g., as a semiconductor channel 204) and dielectric material(s) (e.g., as a memory film 206). In some embodiments, semiconductor channel 204 includes silicon, such as amorphous silicon, polysilicon, or single crystalline silicon. In some embodiments, memory film 206 is a composite layer including a tunneling layer, a storage layer (also known as a "charge trap/storage layer"), and a blocking layer. 3D NAND memory string 200 can have a cylinder shape (e.g., a pillar shape). Semiconductor channel 204, the tunneling layer, the storage layer, and the blocking layer are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the blocking layer can include a composite layer of silicon oxide/silicon oxynitride/silicon oxide (ONO).

In some embodiments, the channel structure of 3D NAND memory string 200 extends vertically through a memory stack (not shown) having interleaved conductive layers and dielectric layers. Parts of the conductive layers surrounding the channel structure of 3D NAND memory string 200 are control gates 208 of memory cells 210 in 3D NAND memory string 200, according to some embodiments. Memory cells 210 can be arranged vertically in series in 3D NAND memory string 200. In some embodiments, each memory cell 210 includes control gate 208 and parts of semiconductor channel 204 and memory film 206 surrounded by control gate 208. The conductive layers from which control gates 208 are formed are also known as the word lines (e.g., word lines 118 in FIG. 1) coupled to 3D NAND memory string 200, which can receive word line bias voltages $V_{WL}$ for controlling operations of memory cells 210, e.g., by reading, erasing, and programming operations. The conductor layers can include conductive materials including, but not limited to, tungsten (W), cobalt (Co), copper (Cu), aluminum (Al), polysilicon, doped silicon, silicides, or any combination thereof.

It is noted that x and y axes are included in FIG. 2 to further illustrate the spatial relationship of the components in 3D NAND memory string 200. Substrate 202 includes two lateral surfaces (e.g., a top surface and a bottom surface) extending laterally in the x-direction (i.e., the lateral direction). As used herein, whether one component (e.g., a first memory cell) is "on," "above," or "below" another component (e.g., a second memory cell) of a semiconductor structure (e.g., 3D NAND memory string 200) is determined relative to the substrate of the semiconductor structure (e.g., substrate 202) in the y-direction (i.e., the vertical direction or depth direction) when the substrate is positioned in the lowest plane of the semiconductor structure in the y-direction. The same notion for describing spatial relationship is applied throughout the present disclosure.

The channel structure of 3D NAND memory string 200 can include a nonuniform lateral dimension (e.g., diameter) along the vertical direction as a result of deep hole etching process. In some embodiments, the diameter of the channel structure of 3D NAND memory string 200 increases from bottom to top. Due to the nonuniform lateral dimension distribution along the vertical direction of the channel structure of 3D NAND memory string 200, memory cells 210 at different cell depths of 3D NAND memory string 200 can be associated with different channel lateral dimensions, e.g., the diameter. In some embodiments, for any two memory cells 210, the upper memory cell is associated with a greater channel diameter than the lower memory cell.

Referring back to FIG. 1, peripheral circuit 104 can include any suitable digital, analog, and/or mixed-signal circuits used for facilitating the operations of 3D memory device 100. For example, peripheral circuit 104 can include one or more of a data buffer (e.g., a bit line page buffer), a decoder (e.g., a row decoder or a column decoder), a sense amplifier, a driver (e.g., a word line driver), a charge pump, a current or voltage reference, or any active or passive components of the circuits (e.g., transistors, diodes, resistors, or capacitors). In some embodiments, peripheral circuit 104 is formed using complementary metal-oxide-semiconductor (CMOS) technology.

Figure 3:
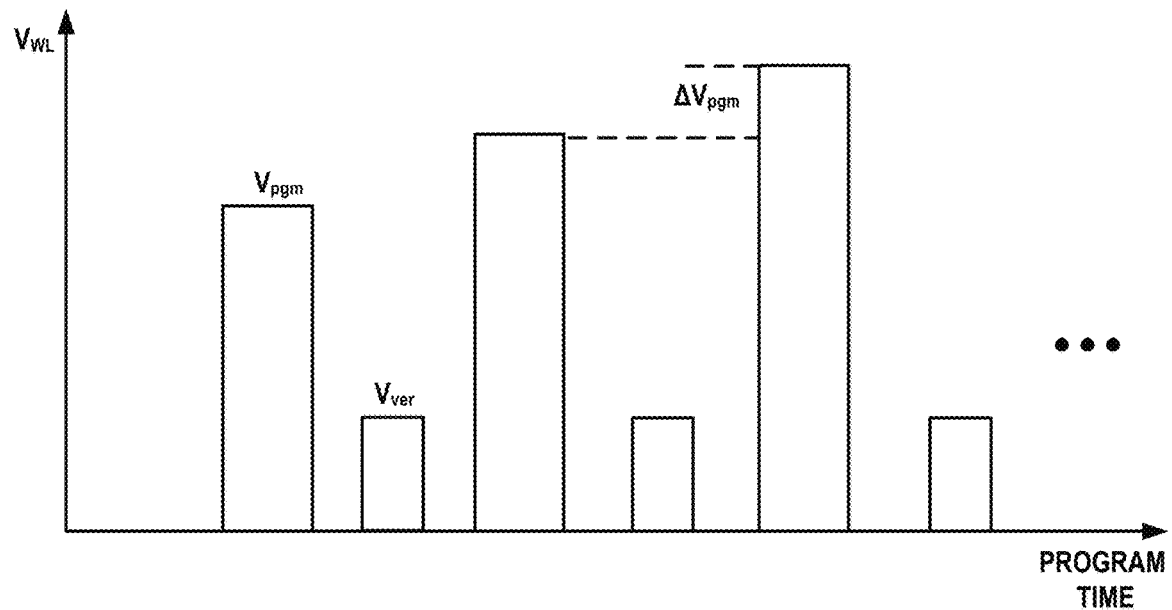
FIG. 3 illustrates an exemplary waveform of ISPP, according to some embodiments of the present disclosure.

In some embodiments, peripheral circuit 104 includes word line drivers 122 and a logic state control module 124 coupled to word line drivers 122. Word line drivers 122 in conjunction with logic state control module 124 can implement an incremental step pulse programming (ISPP) scheme for programming memory cells 106 in memory array device 102. ISPP is one approach for programming memory states in MLCs and SLCs. FIG. 3 illustrates an exemplary waveform of ISPP, according to some embodiments of the present disclosure. The waveform of ISPP can be provided by peripheral circuit 104 to each page of memory cells 120 through word lines 118 in the form of word line bias voltages $V_{WL}$.

As shown in FIG. 3, a program voltage $V_{pgm}$ is applied to the control gate of a selected memory cell using short successive program pulses of increasing magnitude. If, for example, a memory page is selected for a programming operation, a bias voltage is applied to the word line to which the memory cells of the memory page are coupled. The ISPP scheme programs the selected memory page several times while gradually increasing the word line bias voltage on a step-voltage basis. The magnitude of this "step" (e.g., the increase in magnitude of each pulse relative to the immediately previous pulse) is referred to herein as the "pulse step height" $\Delta V_{pgm}$. Between each pulse of increased magnitude, a program verification operation is performed to check whether each of the selected memory cells has a threshold voltage that has risen above the level of a verification voltage $V_{ver}$ of that memory cell. The ISPP scheme continues until the threshold voltage of each of the selected memory cells in the memory page rises above the corresponding verification voltage $V_{ver}$ so that the threshold voltage of each of the memory cells represents a desired memory state.

Referring back to FIG. 1, in some embodiments, the waveform of the ISPP, e.g., the program voltage $V_{pgm}$ (including the pulse step height $\Delta V_{pgm}$) and the verification voltage $V_{ver}$, is controlled by logic state control module 124 of peripheral circuit 104 and provided to word line drivers 122. Word line drivers 122 can be configured to select word line(s) 118 (i.e., page(s) of memory cells 120 to be programmed) and sequentially apply the corresponding waveforms of word line bias voltage $W_{WL}$ to each selected word line 118 to program memory cells 106 in corresponding page of memory cells 120. The novel ISPP schemes and waveforms hereof that can be controlled by logic state control module 124 and applied by word line drivers 122 of peripheral circuit 104 are described below in detail.

As described above with respect to FIG. 2, in some 3D NAND memory devices, the diameter of channel structure is not uniform in the vertical direction, but gradually decreases from top to bottom, due to the process limitations of deep hole etching techniques, which can cause nonuniform erasing speed for memory cells along the channel structure. On the other hand, some 3D NAND memory devices perform erasing operations by applying a positive voltage to the p-well and grounding the control gate of the selected memory cell. As a result, the drain of the memory cell is floating, and the positive voltage can propagate from the p-well up to the entire NAND memory string (e.g., polysilicon channel). However, in practice, the channel voltage may attenuate during propagation, which causes the erasing voltage to become lower at the upper end than at the lower end of the NAND memory string. Considering the two factors of channel diameter and erasing voltage, the erasing speed of each memory cell along the NAND memory string decreases from bottom to top. Thus, after the block erasing operation, the threshold voltage of each memory cell at the erased state (e.g., "1") increases from bottom to top in the NAND memory string.

To perform the subsequent programming operation, the 3D NAND memory devices can change the threshold voltage of each selected memory cell to the programmed state (e.g., "0") using an ISPP scheme, as described above with respect to FIG. 3. The ISPP scheme can apply a verification voltage $V_{ver}$ to check whether the current cell threshold voltage reaches to the target cell threshold voltage and stops the programming operation when the above condition is met, thereby ensuring all the selected memory cells are programmed to the same target cell threshold voltage at the programmed state.

Figure 4A:
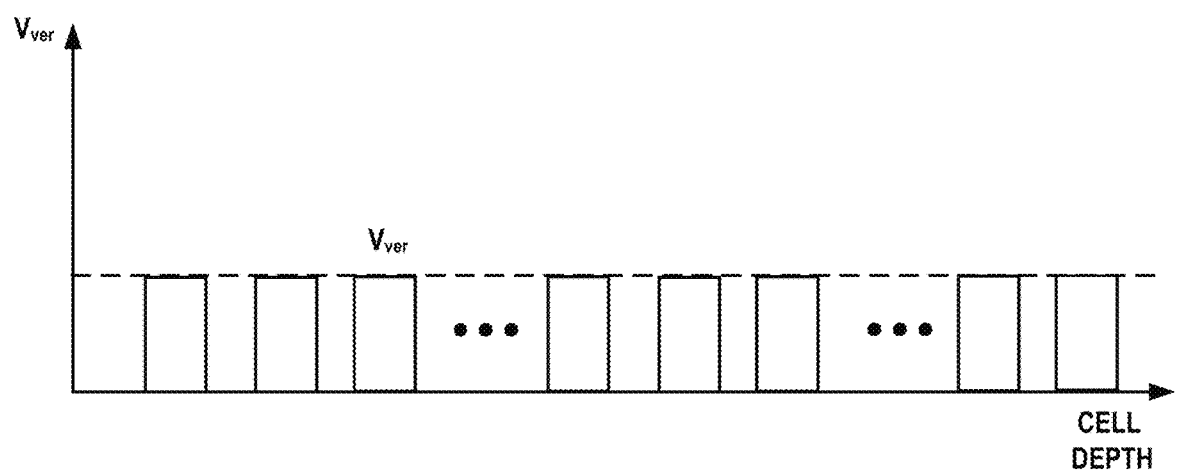
FIG. 4A illustrates a verification voltage scheme of ISPP for programming memory cells at different cell depths.
Figure 4B:
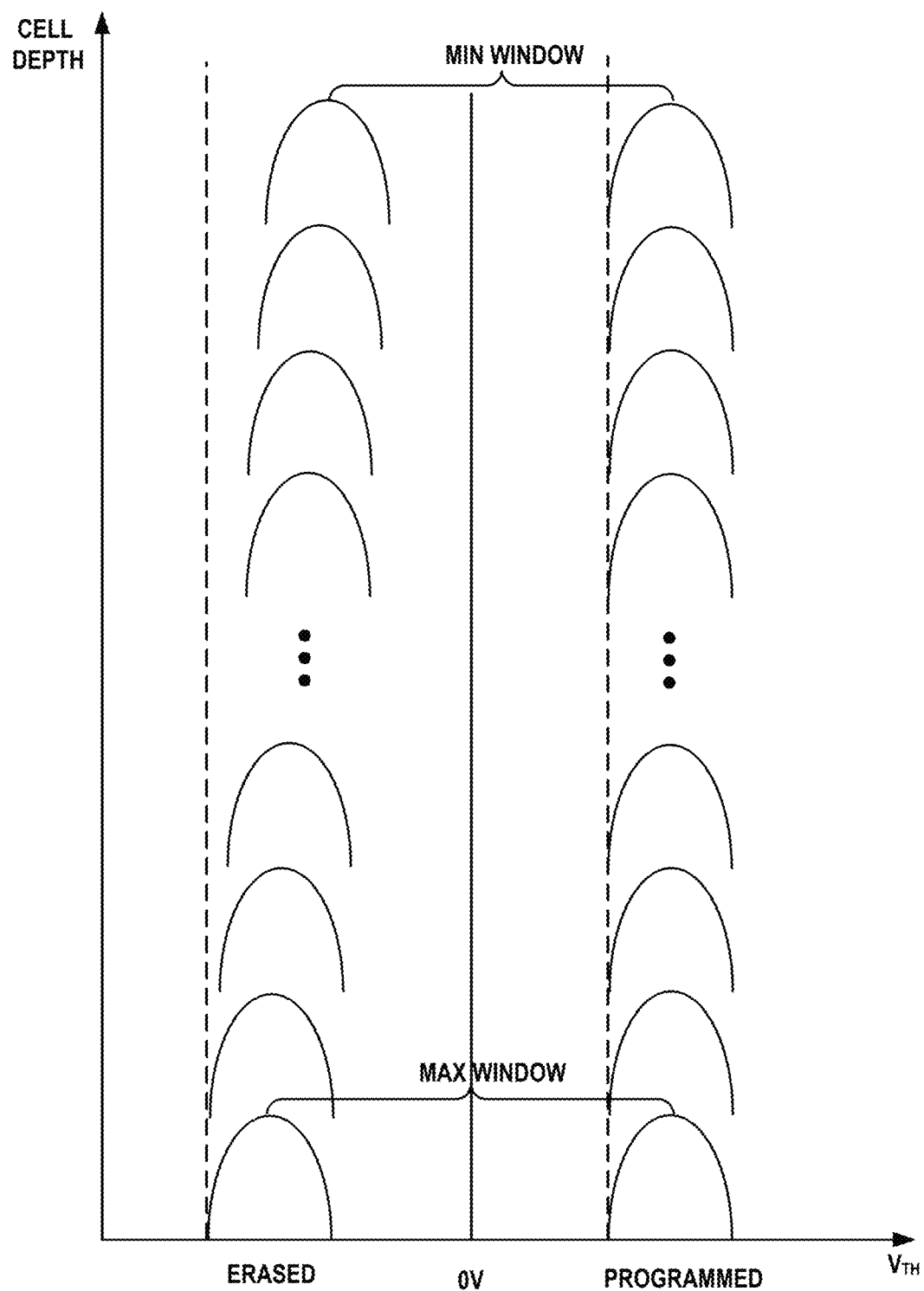
FIG. 4B illustrates threshold voltage windows between erased and programmed states for memory cells at different cell depths.

In some 3D NAND memory devices, the same verification voltage $V_{ver}$ is applied to all the selected memory cells (or memory pages) regardless of the different cell depths in the vertical direction of the corresponding 3D NAND memory strings, as shown in FIG. 4A. As a result, all the selected memory cells after programming have nominally the same threshold voltage at the programmed state regardless of their cell depths, as shown in FIG. 4B. It is understood that although the threshold voltage of a memory cell is plotted as a Gaussian-like distribution in FIG. 4B, the threshold voltage can be referred to herein as the maximum value of the Gaussian-like distribution for ease of description. As described above, after the block erasing operation and prior to the programming operation, the threshold voltage of each memory cell at the erased state increases from bottom to top in the 3D NAND memory strings, as shown in FIG. 4B as well.

A threshold voltage window between erased and programmed states with certain width is needed for reading operations. The threshold voltage window for each of the selected memory cells at a respective cell depth can be determined based on the threshold voltages of the memory cell at the erase state and the programmed states. As shown in FIG. 4B, the size of threshold voltage windows of memory cells decreases from bottom to top in a 3D NAND memory string. That is, the memory cell on the bottom of the 3D NAND memory string has the maximum threshold voltage window, while the memory cell on the top of the 3D NAND memory string has the minimum threshold voltage window, according to some embodiments.

Because of the size difference of threshold voltage windows for memory cells at different cell depths, one or more of the threshold voltage windows for lower memory cells need to be larger than the standard value in order to ensure that threshold voltage windows for upper memory cells can meet the standard value. In NAND Flash memory devices, the erasing and programming operations utilize a process known as Fowler-Nordheim (FN) tunneling, which can introduce and accumulate defects in the blocking layer of memory film and eventually, make the NAND Flash memory devices inoperable, e.g., failing to erase and program. The larger the threshold voltage window is (requiring greater erasing and programming depth), the greater the damage is to the blocking layer. Since the threshold voltage window is larger at the bottom than at the top, the lower memory cells receive more damages than the upper memory cells in the 3D NAND memory strings in some 3D memory devices.

Peripheral circuit (e.g., peripheral circuit 104) disclosed herein can implement a novel ISPP scheme for programming memory cells of 3D memory devices to overcome the above-noted drawbacks. Instead of using the same verification voltage $V_{ver}$ for all the memory cells at different cell depths, the novel ISPP scheme can apply different verification voltages $V_{ver}$ for memory cells at different cell depths, such that the threshold voltage windows for memory cells at different cell depths can have similar sizes, or even become nominally the same. The various verification voltage schemes disclosed herein can be implemented by peripheral circuit 104 as part of the ISPP schemes for programming memory cells 106 in 3D memory device 100. In some embodiments, peripheral circuit 104 is configured to program memory cells 106 in NAND memory string 108 based on ISPP, and different verification voltages of the ISPP are applied to at least two of memory cells 106 at different cell depths in NAND memory string 108. In some embodiments, peripheral circuit 104 is configured to program memory cells 106 in each NAND memory string 108 through word lines 118 based on ISPP, and different verification voltages of the ISPP are applied to at least two pages of memory cells 120 at different cell depths. In some embodiments, a first verification voltage applied to a first memory cell is smaller than a second verification voltage applied to a second memory cell that is above the first memory cell in the NAND memory string (e.g., 3D NAND memory string 200).

Figure 5A:
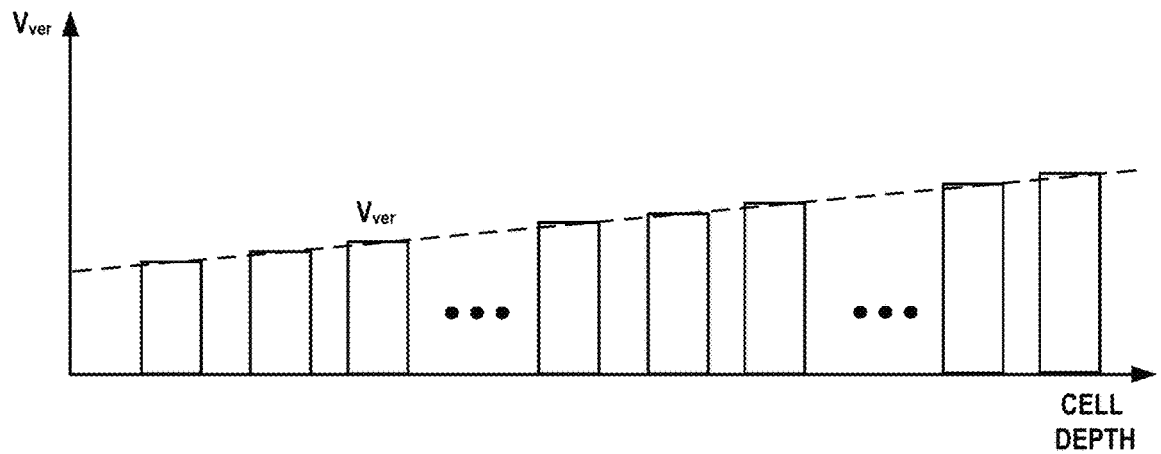
FIGS. 5A-5B illustrate various exemplary verification voltage schemes of ISPP for programming memory cells at different cell depths, according to various embodiments of the present disclosure.
Figure 5B:
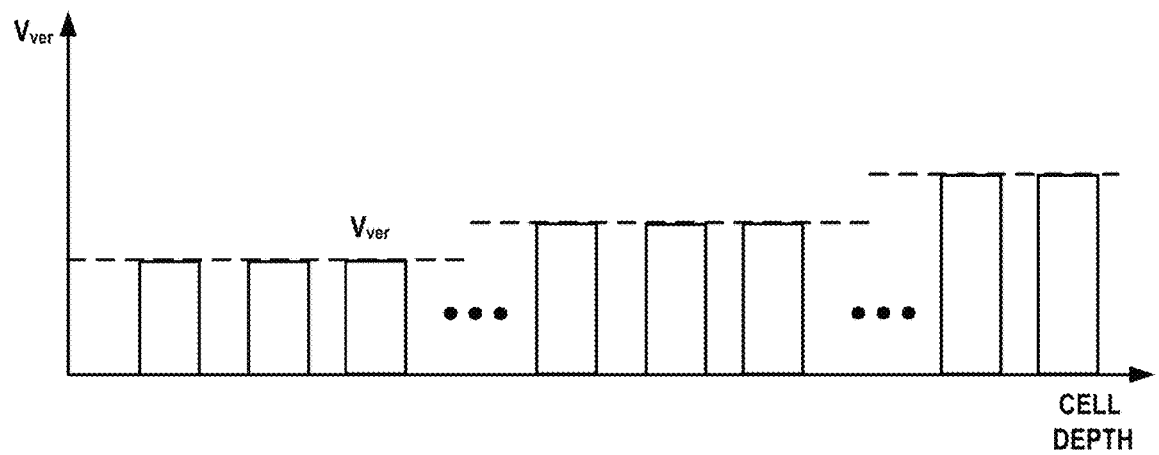

FIGS. 5A-5B illustrate various exemplary verification voltage schemes of ISPP for programming memory cells at different cell depths, according to various embodiments of the present disclosure. As shown in FIG. 5A, the verification voltage $V_{ver}$ applied to each memory cell (or each page of memory cell at nominally the same cell depth) increase from bottom to top of the NAND memory strings (as the cell depth increases). In some embodiments, the increase is linear, i.e., the difference between any two adjacent verification voltages $V_{ver}$ in FIG. 5A is nominally the same. It is understood that in some embodiments, the increase is nonlinear. As shown in FIG. 5B, the same verification voltage $V_{ver}$ is applied to some memory cells at adjacent cell depths, but in general, the verification voltage $V_{ver}$ increases as the cell depth increases. It is understood that any other suitable verification voltage schemes can be applied as long as different verification voltages are applied to at least two of memory cells at different cell depths.

Figure 6:
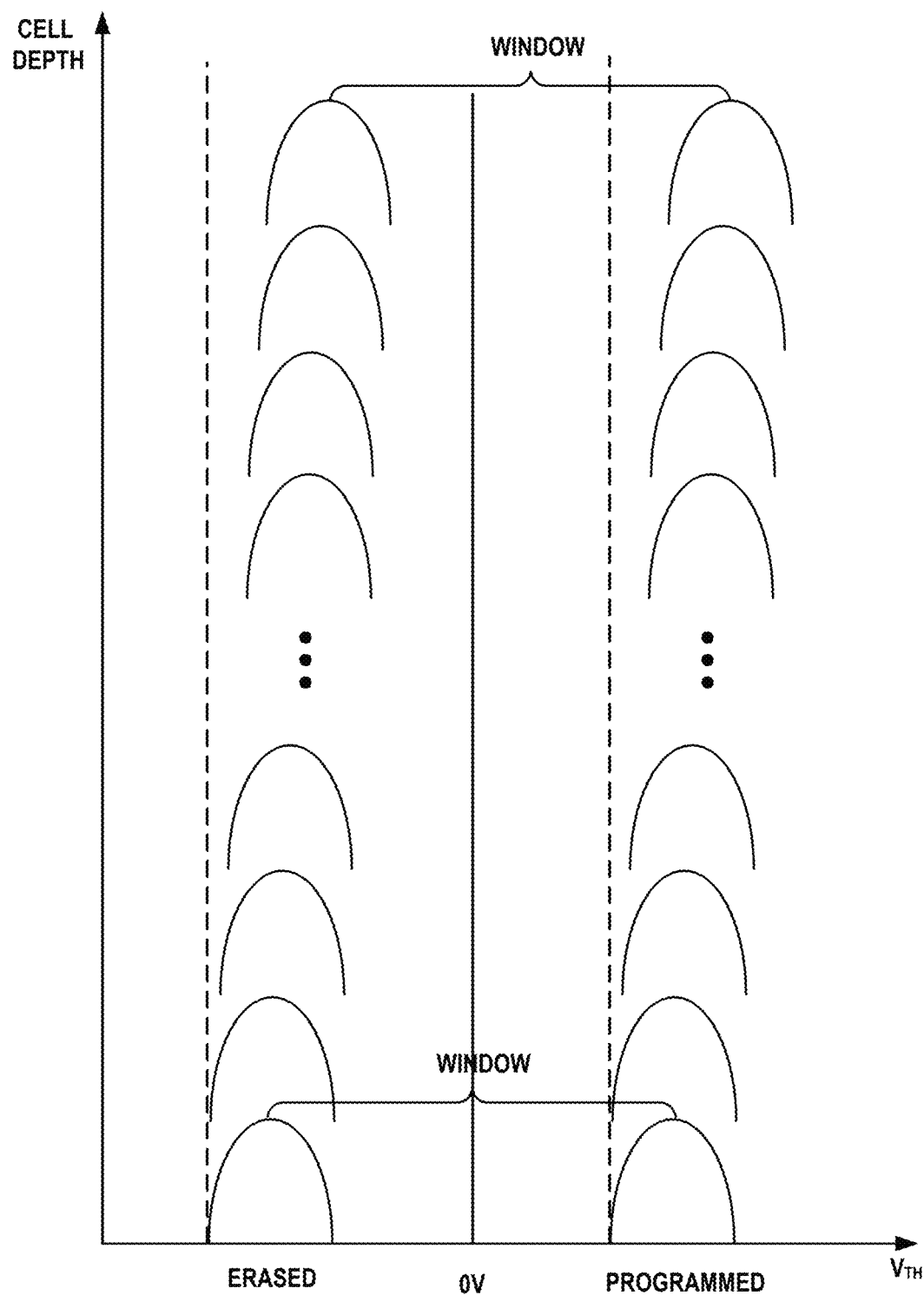
FIG. 6 illustrates exemplary threshold voltage windows between erased and programmed states for memory cells at different cell depths, according to some embodiments of the present disclosure.

FIG. 6 illustrates exemplary threshold voltage windows between erased and programmed states for memory cells at different cell depths, according to some embodiments of the present disclosure. As a result of the novel ISPP scheme with nonuniform verification voltages, the threshold voltages of each memory cell (or each page of memory cell) increase from bottom to top of a 3D NAND memory string. By setting up appropriate verification voltages for memory cells at different cell depths, the threshold voltage windows for memory cells at different cell depths can be adjusted to reduce the variations at different cell depths. In some embodiments, the variations are minimized such that the threshold voltage window between erased and programmed states is nominally the same for each memory cell (or each page of memory cells) regardless of their cell depths. The verification voltages can be set up based on the threshold voltages of each memory cell (or each page of memory cells) at different cell depths at the erased state after the block erasing operation.

Figure 7:
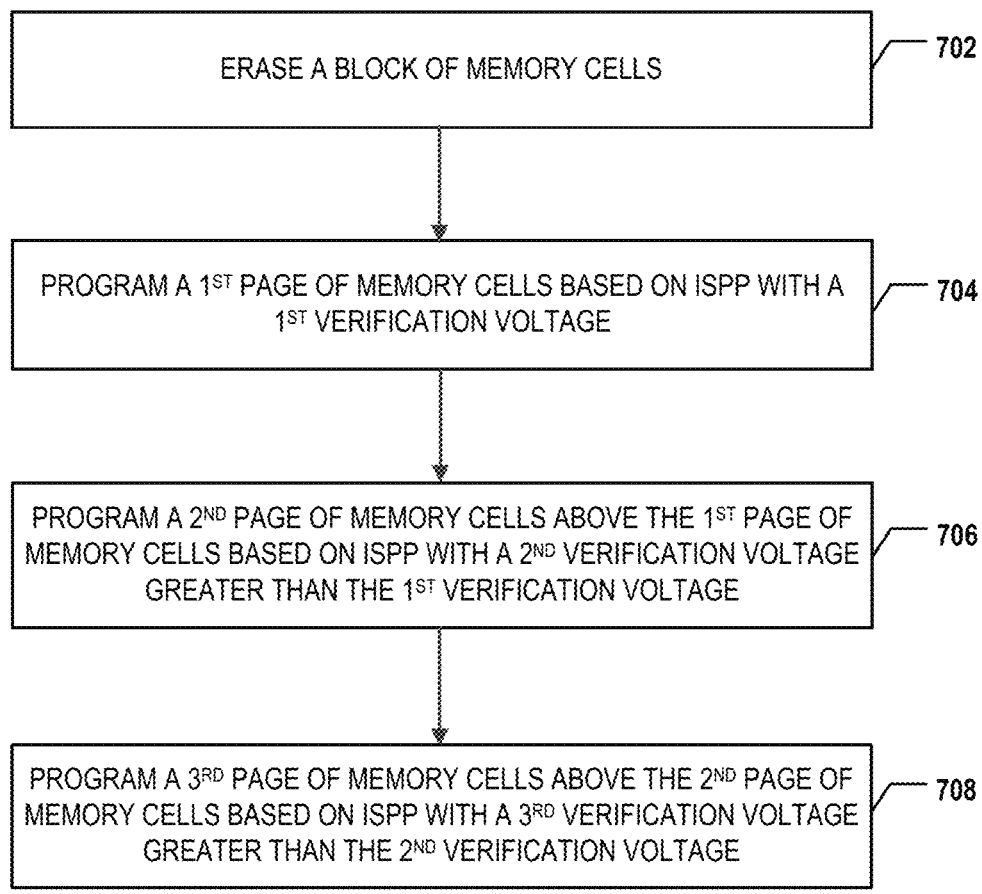
FIG. 7 is a flowchart of an exemplary method for operating a 3D memory device, according to some embodiments of the present disclosure.

FIG. 7 is a flowchart of an exemplary method 700 for operating a 3D memory device, according to some embodiments of the present disclosure. Examples of the 3D memory device depicted in FIG. 7 include 3D memory devices 100 depicted in FIG. 1. It is understood that the operations shown in method 700 are not exhaustive and that other operations can be performed as well before, after, or between any of the illustrated operations. Further, some of the operations may be performed simultaneously, or in a different order than shown in FIG. 7.

Referring to FIG. 7, method 700 starts at operation 702, in which a block of memory cells is erased. In some embodiments as shown in FIG. 1, a block erasing operation is performed by peripheral circuit 104 to erase all memory cells 106 in the same memory block. After the block erasing operation, each memory cell 106 can have a threshold voltage at the erased state. In some embodiments, due to the nonuniform lateral dimension of the channel structure of 3D NAND memory string 200, memory cells 210 at different cell depths have different threshold voltages at the erased state, which, for example, increase from bottom to top of 3D NAND memory string 200.

Method 700 proceeds to operation 704, as illustrated in FIG. 7, in which a first memory cell in a first page of memory cells in a 3D NAND memory string is programmed based on ISPP with a first verification voltage. Method 700 proceeds to operation 706, as illustrated in FIG. 7, in which a second memory cell in a second page of memory cells in the 3D NAND memory string is programmed based on ISSP with a second verification voltage. In some embodiments, the second memory cell (and the second page of memory cells) is above the first memory cell (and the first page of memory cells) in the 3D NAND memory string, and a first diameter of a channel structure of the 3D NAND memory string at the first memory cell of the first page of memory cells is smaller than a second diameter of the channel structure at the second memory cell of the second page of memory cells.

In some embodiments as shown in FIG. 1, the second verification voltage is greater than the first verification voltage, as controlled by logic state control module 124 of peripheral circuit 104. Prior to programming the first and second memory cells, a first erased threshold voltage of the first memory cell is smaller than a second erased threshold voltage of the second memory cell, according to some embodiments. After programming the first and second memory cells, a first threshold voltage window for the first memory cell can be nominally the same as a second threshold voltage window for the second memory cell.

Method 700 proceeds to operation 708, as illustrated in FIG. 7, in which a third memory cell in a third page of memory cells in the 3D NAND memory string is programmed based on ISSP with a third verification voltage. In some embodiments, the third memory cell (and the third page of memory cells) is above the second memory cell (and the second page of memory cells) in the 3D NAND memory string, and a third diameter of the channel structure of the 3D NAND memory string at the third memory cell of the third page of memory cells is greater than the second diameter of the channel structure at the second memory cell of the second page of memory cells.

In some embodiments as shown in FIG. 1, the third verification voltage is greater than the second verification voltage, as controlled by logic state control module 124 of peripheral circuit 104. In some embodiments, the difference between the first and second verification voltages is nominally the same as the difference between the second and third verification voltages. During the programming operations, the first, second, and third memory cells (or the first, second, and third pages of memory cells) can be selected by word line drivers 122 of peripheral circuit 104, and the waveforms of ISPP for programming each of the first, second, and third memory cells (or the first, second, and third pages of memory cells) can be sequentially applied by word line drivers 122 through word lines 118.

According to one aspect of the present disclosure, a 3D memory device includes a NAND memory string and a peripheral circuit. The NAND memory string extends vertically above a substrate and includes a plurality of memory cells arranged vertically in series. The peripheral circuit is configured to program the memory cells based on ISPP. Different verification voltages of the ISPP are applied to at least two of the memory cells.

In some embodiments, a first verification voltage applied to a first one of the memory cells is smaller than a second verification voltage applied to a second one of the memory cells that is above the first one of the memory cells in the NAND memory string. In some embodiments, verification voltages applied to each of the memory cells increase from bottom to top of the NAND memory string. The increase of the verification voltages can be linear.

In some embodiments, a diameter of a channel structure of the NAND memory string increases from bottom to top of the NAND memory string.

In some embodiments, the peripheral circuit is further configured to, prior to programming the memory cells, erase the memory cells, such that erased threshold voltages of the at least two of the memory cells are different. In some embodiments, a threshold voltage window between erased and programmed states is nominally the same for each of the memory cells.

In some embodiments, each of the memory cells is a SLC. In some embodiments, each of the memory cells is an MLC.

According to another aspect of the present disclosure, a 3D memory device includes a memory array device and a peripheral circuit. The memory array device includes a plurality of NAND memory strings and a plurality of word lines. Each of the NAND memory strings extends vertically above a substrate and includes a plurality of memory cells arranged vertically each at a respective cell depth. Each of the word lines is coupled to a page of memory cells at a same cell depth. The peripheral circuit is coupled to the memory array device and configured to program the memory cells in each of the NAND memory strings through the word lines based on ISPP. Different verification voltages of the ISPP are applied to at least two pages of memory cells at different cell depths.

In some embodiments, a first verification voltage applied to a first page of memory cells at a first cell depth is smaller than a second verification voltage applied to a second page of memory cells at a second cell depth greater than the first cell depth. In some embodiments, verification voltages applied to each page of memory cells increase from bottom to top of the NAND memory strings. The increase of the verification voltages can be linear.

In some embodiments, a diameter of a channel structure of each of NAND memory strings increases from bottom to top of the NAND memory string.

In some embodiments, the peripheral circuit is further configured to, prior to programming the memory cells, erase the memory cells, such that erased threshold voltages of the at least two pages of memory cells are different.

In some embodiments, a threshold voltage window between erased and programmed states is nominally the same for each of the memory cells. In some embodiments, a threshold voltage window between erased and programmed states is nominally the same for each page of memory cells.

In some embodiments, each of the memory cells is a SLC. In some embodiments, each of the memory cells is an MLC.

According to still another aspect of the present disclosure, a method for operating a 3D memory device is disclosed. A first memory cell in a 3D NAND memory string is programmed based on ISPP with a first verification voltage. A second memory cell in the 3D NAND memory string is programmed based on ISSP with a second verification voltage. The second verification voltage is greater than the first verification voltage. The second memory cell is above the first memory cell in the 3D NAND memory string.

In some embodiments, a third memory cell in the 3D NAND memory string is programmed based on ISSP with a third verification voltage. The third memory cell is above the second memory cell in the 3D NAND memory string. The third verification voltage is greater than the second verification voltage. In some embodiments, a difference between the first and second verification voltages is nominally the same as a difference between the second and third verification voltages.

In some embodiments a first diameter of a channel structure of the 3D NAND memory string at the first memory cell is smaller than a second diameter of the channel structure at the second memory cell.

In some embodiments, prior to programming the first and second memory cells, the first and second memory cells are erased, such that a first erased threshold voltage of the first memory cell is smaller than a second erased threshold voltage of the second memory cell. In some embodiments, after programming the first and second memory cells, a first threshold voltage window for the first memory cell is nominally the same as a second threshold voltage window for the second memory cell.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a NAND memory string extending vertically above a substrate and comprising a plurality of memory cells arranged vertically in series; and
a peripheral circuit configured to program the memory cells based on incremental step pulse programming (ISPP), wherein different verification voltages of the ISPP are applied to at least two of the memory cells,
wherein a first verification voltage applied to a first one of the memory cells is smaller than a second verification voltage applied to a second one of the memory cells that is above the first one of the memory cells in the NAND memory string, and
verification voltages applied to each of the memory cells increase from bottom to top of the NAND memory string.

2. The 3D memory device of claim 1, wherein the increase of the verification voltages is linear.

3. The 3D memory device of claim 1, wherein a diameter of a channel structure of the NAND memory string increases from bottom to top of the NAND memory string.

4. The 3D memory device of claim 1, wherein the peripheral circuit is further configured to, prior to programming the memory cells, erase the memory cells, such that erased threshold voltages of the at least two of the memory cells are different.

5. A three-dimensional (3D) memory device, comprising:
a memory array device comprising:
a plurality of NAND memory strings, each of the NAND memory strings extending vertically above a substrate and comprising a plurality of memory cells arranged vertically each at a respective cell depth; and a plurality of word lines, each of the word lines coupled to a page of memory cells at a same cell depth; and
a peripheral circuit coupled to the memory array device and configured to program the memory cells in each of the NAND memory strings through the word lines based on incremental step pulse programming (ISPP), wherein different verification voltages of the ISPP are applied to at least two pages of memory cells at different cell depths,
wherein a first verification voltage applied to a first page of memory cells at a first cell depth is smaller than a second verification voltage applied to a second page of memory cells at a second cell depth greater than the first cell depth, and
verification voltages applied to each page of memory cells increase from bottom to top of the NAND memory strings.

6. The 3D memory device of claim 5, wherein the increase of the verification voltages is linear.

7. The 3D memory device of claim 5, wherein a diameter of a channel structure of each of NAND memory strings increases from bottom to top of the NAND memory string.

8. The 3D memory device of claim 5, wherein the peripheral circuit is further configured to, prior to programming the memory cells, erase the memory cells, such that erased threshold voltages of the at least two pages of memory cells are different.

9. A method for operating a three-dimensional (3D) memory device, comprising:
erasing a first memory cell in a 3D NAND memory string and a second memory cell in the 3D NAND memory string, such that a first erased threshold voltage of the first memory cell is smaller than a second erased threshold voltage of the second memory cell;
programming the first memory cell in the 3D NAND memory string based on incremental step pulse programming (ISPP) with a first verification voltage; and
programming the second memory cell in the 3D NAND memory string based on ISSP with a second verification voltage,
wherein the second verification voltage is greater than the first verification voltage, and
the second memory cell is above the first memory cell in the 3D NAND memory string.

10. The method of claim 9, further comprising programming a third memory cell in the 3D NAND memory string based on ISSP with a third verification voltage,
wherein the third memory cell is above the second memory cell in the 3D NAND memory string, and
the third verification voltage is greater than the second verification voltage.

11. The method of claim 10, wherein a difference between the first and second verification voltages is nominally the same as a difference between the second and third verification voltages.

12. The method of claim 9, wherein after programming the first and second memory cells, a first threshold voltage window for the first memory cell is nominally the same as a second threshold voltage window for the second memory cell.

13. A three-dimensional (3D) memory device, comprising:
a NAND memory string extending vertically above a substrate and comprising a plurality of memory cells arranged vertically in series; and
a peripheral circuit configured to program the memory cells based on incremental step pulse programming (ISPP), wherein different verification voltages of the ISPP are applied to at least two of the memory cells, wherein a threshold voltage window between erased and programmed states is nominally the same for each of the memory cells.

14. The 3D memory device of claim 13, wherein a first verification voltage applied to a first one of the memory cells is smaller than a second verification voltage applied to a second one of the memory cells that is above the first one of the memory cells in the NAND memory string.

15. The 3D memory device of claim 13, wherein verification voltages applied to each of the memory cells increase from bottom to top of the NAND memory string.

16. The 3D memory device of claim 15, wherein the increase of the verification voltages is linear.

17. The 3D memory device of claim 13, wherein a diameter of a channel structure of the NAND memory string increases from bottom to top of the NAND memory string.

18. The 3D memory device of claim 13, wherein each of the memory cells is a single-level cell (SLC) or a multiple-level cell (MLC).

19. A three-dimensional (3D) memory device, comprising:
a memory array device comprising:
a plurality of NAND memory strings, each of the NAND memory strings extending vertically above a substrate and comprising a plurality of memory cells arranged vertically each at a respective cell depth; and
a plurality of word lines, each of the word lines coupled to a page of memory cells at a same cell depth; and
a peripheral circuit coupled to the memory array device and configured to program the memory cells in each of the NAND memory strings through the word lines based on incremental step pulse programming (ISPP), wherein different verification voltages of the ISPP are applied to at least two pages of memory cells at different cell depths, and
a threshold voltage window between erased and programmed states is nominally the same for each page of memory cells.

20. The 3D memory device of claim 16, wherein a first verification voltage applied to a first page of memory cells at a first cell depth is smaller than a second verification voltage applied to a second page of memory cells at a second cell depth greater than the first cell depth.

* * * * *